US007608540B2

(12) United States Patent
Park et al.

(10) Patent No.: US 7,608,540 B2
(45) Date of Patent: Oct. 27, 2009

(54) COMPOSITION FOR REMOVING A PHOTORESIST, METHOD OF PREPARING THE COMPOSITION, METHOD OF REMOVING A PHOTORESIST AND METHOD OF MANUFACTURING A SEMICONDUCTOR DEVICE USING THE COMPOSITION

(75) Inventors: Jung-Dae Park, Seoul (KR); Pil-Kwon Jun, Yongin-si (KR); Myoung-Ok Han, Suwon-si (KR); Se-Yeon Kim, Seoul (KR); Kwang-Shin Lim, Yongin-si (KR); Tae-Hyo Choi, Yongin-si (KR); Seung-Ki Chae, Seoul (KR); Yang-Koo Lee, Gwacheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 629 days.

(21) Appl. No.: 11/406,243

(22) Filed: Apr. 19, 2006

(65) Prior Publication Data

US 2006/0287207 A1 Dec. 21, 2006

(30) Foreign Application Priority Data

Jun. 15, 2005 (KR) ...................... 10-2005-0051421

(51) Int. Cl.
*H01L 29/00* (2006.01)
*C11D 7/26* (2006.01)
*C11D 7/32* (2006.01)
*C11D 7/50* (2006.01)

(52) U.S. Cl. ...................... 438/689; 438/478; 510/175; 510/176; 510/499; 510/502; 510/505; 510/506

(58) Field of Classification Search ................. 438/478, 438/689; 510/175, 176, 499, 502, 505, 506
See application file for complete search history.

(56) References Cited

U.S. PATENT DOCUMENTS

| | | | | |
|---|---|---|---|---|
| 2003/0022800 | A1 * | 1/2003 | Peters et al. | 510/175 |
| 2004/0266637 | A1 * | 12/2004 | Rovito et al. | 510/176 |

FOREIGN PATENT DOCUMENTS

| | | |
|---|---|---|
| JP | 2003-0686699 | 3/2003 |
| JP | 2003-122028 | 4/2003 |
| JP | 2004-029346 | 1/2004 |
| JP | 10-2004-0032111 | 4/2004 |

* cited by examiner

*Primary Examiner*—Gregory R Del Cotto
(74) *Attorney, Agent, or Firm*—Volentine & Whitt, PLLC

(57) ABSTRACT

A composition for removing a photoresist includes about 5 to about 20 percent by weight of an alcoholamide compound, about 15 to about 60 percent by weight of a polar aprotic solvent, about 0.1 to about 6 percent by weight of an additive, and pure water. The alcoholamide compound is chemically structured as follows:

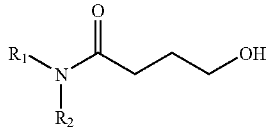

where $R_1$ is a hydroxyl group or a hydroxyalkyl group, and $R_2$ is a hydrogen atom or a hydroxyalkyl group.

18 Claims, 14 Drawing Sheets

COMPOSITION FOR REMOVING A PHOTORESIST, METHOD OF PREPARING THE COMPOSITION, METHOD OF REMOVING A PHOTORESIST AND METHOD OF MANUFACTURING A SEMICONDUCTOR DEVICE USING THE COMPOSITION

BACKGROUND OF THE INVENTION

1. Field of the Invention

The present invention generally relates to the fabrication of semiconductor devices. More particularly, the present invention relates compositions for removing a photoresist, methods of preparing the compositions, methods of removing a photoresist using the compositions, and methods of manufacturing a semiconductor device using the compositions.

A claim of priority under 35 U.S.C. ¶119 is made to Korean patent application no. 2005-51421, filed Jun. 15, 2005, the entirety of which is incorporated herein by reference.

2. Description of the Related Art

In the fabrication of semiconductor devices, photolithography processes are utilized in the patterning of various layers of the devices. In photolithography, a photoresist pattern is formed by selectively polymerizing portions of a photoresist layer. The resultant polymer can cause photoresist residues, organic impurities and/or etching residues generated in a later plasma etching process. The plasma etching residues may be formed on sidewalls of an underlying etched pattern and may be difficult to remove using conventional cleaning solutions.

Photoresist removal cleaning solutions typically include hydroxylamine or a fluorine compound. For example, a cleaning solution including a fluorine compound is disclosed in Japanese Laid-Open Patent Publication No. 2004-29346. This cleaning solution includes a strong nucleophilic compound, and may be effective in decomposing and dissolving a denatured polymer and plasma etching residues regardless of the types of photoresist used in the photolithography process. However, cleaning solutions of this type may not be effective in removing composites of recently introduced metals and polymers, and may corrode metal patterns.

In the meantime, a cleaning solution for removing etching residues that includes an alkanolamine compound, an organic solvent and a fluorine compound is disclosed in Japanese Laid-Open Patent Publication No. 2003-68699, and a cleaning solution for removing a photoresist that includes a fluorine compound such as tetramethylammonium fluoride, an organic solvent such as dimethylacetamide, and an additive is disclosed in Korean Laid-Open Patent Publication No. 2004-32111.

The above cleaning solutions exhibit relatively good photoresist removability and good composition stability. However, with respect to various types of metals that have been recently introduced in semiconductor manufacturing processes, the cleaning solutions may not efficiently remove fine etching residues having nanometer dimensions without damage to a metal pattern. For example, in manufacturing processes of a semiconductor device such as a dynamic random access memory (DRAM), a static random access memory (SRAM) or a flash memory device, the cleaning solutions may not completely remove fine etching residues, and may excessively etch an exposed metal layer. Thus, a product yield of the semiconductor devices may be reduced and reliability of the semiconductor devices may be deteriorated. Further, the cleaning solutions have a relatively high viscosity and a poor polymer removability, and thus the cleaning solutions do not effectively remove polymers generated in a process for forming a fine contact hole or a via hole. As a result, the polymers may remain in the contact hole, thus increasing a contact resistance of the semiconductor devices.

SUMMARY OF THE INVENTION

According to an aspect of the present invention, a composition for removing a photoresist is provided which includes about 5 to about 20 percent by weight of an alcoholamide compound, about 15 to about 60 percent by weight of a polar aprotic solvent, about 0.1 to about 6 percent by weight of an additive, and water. The alcoholamide compound is chemically structured as follows:

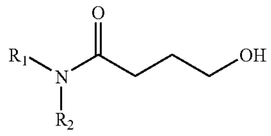

where $R_1$ is a hydroxyl group or a hydroxyalkyl group, and $R_2$ is a hydrogen atom or a hydroxyalkyl group.

According to another aspect of the present invention, a composition for removing a photoresist is provided which includes about 5 to about 20 percent by weight of an alcoholamide compound, about 15 to about 60 percent by weight of a polar aprotic solvent, about 1 to about 30 percent by weight of hydroxylamine, an alkanolamine compound or a mixture thereof, about 0.1 to about 6 percent by weight of an additive, and water. The alcoholamide compound is chemically structured as follows:

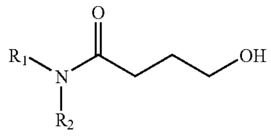

where $R_1$ is a hydroxyl group or a hydroxyalkyl group, and $R_2$ is a hydrogen atom or a hydroxyalkyl group.

According to another aspect of the present invention, a method of preparing a composition for removing a photoresist is provided which include mixing about 5 to about 20 percent by weight of an alcoholamide compound, about 15 to about 60 percent by weight of a polar aprotic solvent, about 0.1 to about 6 percent by weight of an additive, and water. The alcoholamide compound is chemically structured as follows:

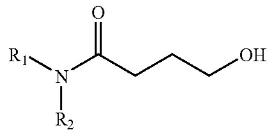

where $R_1$ is a hydroxyl group or a hydroxyalkyl group, and $R_2$ is a hydrogen atom or a hydroxyalkyl group.

According to still another aspect of the present invention, a method of preparing a composition for removing a photoresist is provided which includes mixing about 5 to about 20 percent by weight of an alcoholamide compound, about 15 to about 60 percent by weight of a polar aprotic solvent, about 0.1 to about 6 percent by weight of an additive, about 1 to about 30 percent by weight of hydroxylamine, an alkanolamine compound or a mixture thereof, and water. The alcoholamide compound is chemically structured as follows:

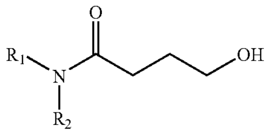

where $R_1$ is a hydroxyl group or a hydroxyalkyl group, and $R_2$ is a hydrogen atom or a hydroxyalkyl group.

According to yet another aspect of the present invention, a method of removing a photoresist is provided which includes providing a composition which includes about 5 to about 20 percent by weight of an alcoholamide compound, about 15 to about 60 percent by weight of a polar aprotic solvent, about 0.1 to about 6 percent by weight of an additive, and water, and applying the composition onto an object coated with a photoresist to remove the photoresist from the object. The alcoholamide compound is chemically structured as follows:

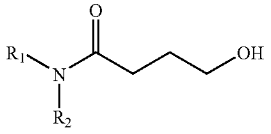

where $R_1$ is a hydroxyl group or a hydroxyalkyl group, and $R_2$ is a hydrogen atom or a hydroxyalkyl group.

According to another aspect of the present invention, a method of manufacturing a semiconductor device is provided which includes forming a layer on a substrate, forming a photoresist pattern on the layer, the photoresist pattern exposing a portion of the layer, and removing the photoresist pattern from the substrate by applying a composition which includes about 5 to about 20 percent by weight of an alcoholamide compound, about 15 to about 60 percent by weight of a polar aprotic solvent, about 0.1 to about 6 percent by weight of an additive, and water. The alcoholamide compound is chemically structured as follows:

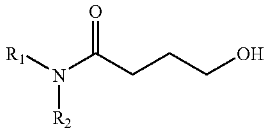

where $R_1$ is a hydroxyl group or a hydroxyalkyl group, and $R_2$ is a hydrogen atom or a hydroxyalkyl group.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF THE INVENTION

Figure 1:
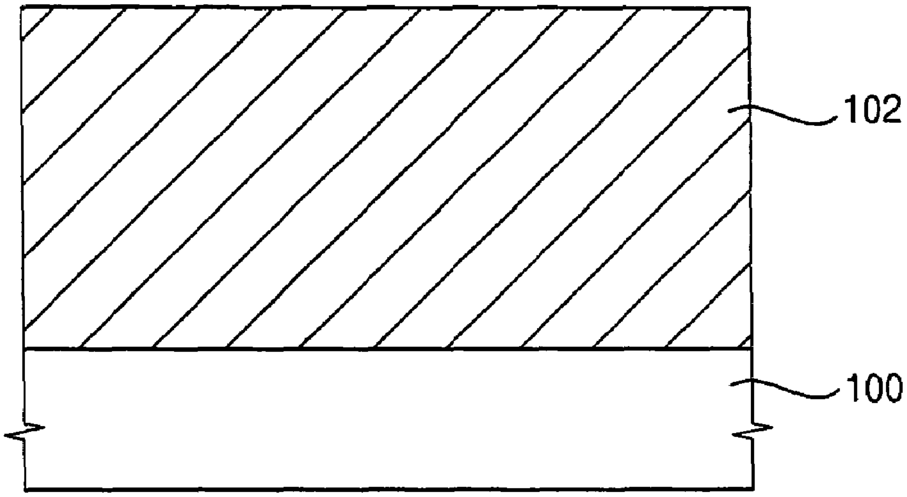
FIGS. 1 to 4 are cross-sectional views for explaining a method of manufacturing a semiconductor device in accordance with an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Compositions for Removing a Photoresist

The compositions for removing a photoresist in accordance with embodiments of the present invention are effective in removing a photoresist pattern used as an etching mask in an etching process and etching residues generated in the etching process, and are also effective in avoiding or reducing damage to a conductive layer pattern and an insulation layer pattern. That is, the compositions may be used to remove both the photoresist and fine plasma etching residues generated in a plasma etching process without causing significant damage to the conductive layer pattern and/or the insulation layer pattern.

First Example Composition for Removing a Photoresist

The first example composition for removing a photoresist according to the present invention includes an alcoholamide compound, a polar aprotic solvent, an additive, and water. More particularly, the first composition includes about 5 to about 20 percent by weight of an alcoholamide compound, about 15 to about 60 percent by weight of a polar aprotic solvent, about 0.1 to about 6 percent by weight of an additive. A remainder of composition is preferably, but not necessarily, all water. The alcoholamide compound is structurally represented by the Chemical Formula (1) present below:

Chemical Formula 1

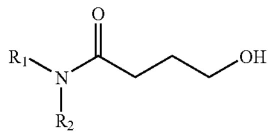

where $R_1$ is a hydroxyl group or a hydroxyalkyl group, and $R_2$ is a hydrogen atom or a hydroxyalkyl group. Examples of an alkyl group in the hydroxyalkyl group may include a methyl group, an ethyl group, a propyl group, an isopropyl group, a butyl group, etc. Particularly, examples of the hydroxyalkyl group of $R_1$ and $R_2$ may independently include a hydroxymethyl group, a hydroxyethyl group, a hydroxypropyl group, a hydroxyisopropyl group and a hydroxybutyl group.

The alcoholamide compound of the first composition may be effective to rapidly swell a polymer generated from the photoresist and the etching residues to enhance respective removabilities of the photoresist and the etching residues. In addition, the alcoholamide may prevent corrosion of the conductive layer pattern such as a metal wiring that is exposed in a cleaning process. In particular, the alcoholamide compound may effectively remove plasma-etching residues having nanometer dimensions that are generated in the plasma etching process, and also prevent or reduce damage to the metal wiring and the insulation layer pattern.

With reference to the Chemical Formulae 2-5 that follow, examples of the alcoholamide compound that may be used in the first composition of the present invention may include 4-hydroxy-N-(2-hydroxyethyl)butyramide (HHBA) (Chemical Formula 2), 4-hydroxy-N,N-bis(2-hydroxyethyl)butyramide (HBHBA) (Chemical Formula 3), 4-hydroxy-N,N-bis (2-hydroxypropyl)butyramide (HBPBA) (Chemical Formula 4), and N,4-dihydroxy butyramide (DHBA) (Chemical Formula 5). These can be used individually or in a mixture of two or more thereof.

Chemical Formula 2

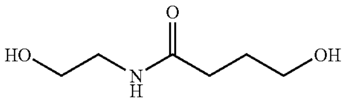

Chemical Formula 3

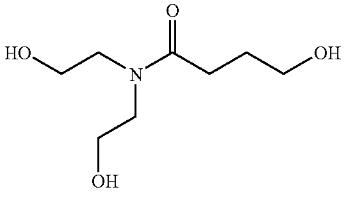

Chemical Formula 4

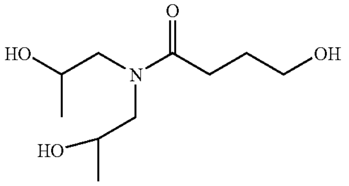

-continued

Chemical Formula 5

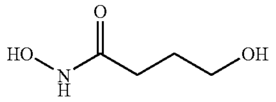

When the first composition includes less than about 5 percent by weight of the alcoholamide compound, the metal wiring exposed to the first composition may be corroded. In addition, when the content of the alcoholamide compound is greater than about 20 percent by weight, corrosion of the metal wiring may be prevented, but the first composition may not effectively remove the photoresist and the etching residues, so that the photoresist and the etching residues may remain after a removal process. Therefore, as mentioned above, the first composition includes about 5 to about 20 percent by weight of the alcoholamide compound based on a total weight of the first composition, preferably about 5 to about 15 percent by weight of the alcoholamide compound, and more preferably about 7.5 to about 15 percent by weight of the alcoholamide compound.

The polar aprotic solvent in the first composition may dissolve the polymer swollen by the alcoholamide compound and the photoresist detached from an object (e.g., a substrate). Further, the polar aprotic solvent may reduce volatility of the first composition, and thus prevent the detached photoresist and the etching residues from being readsorbed onto the substrate.

Examples of the polar aprotic solvent that may be used in the first composition of the present invention may include propylene glycol methyl ether, propylene glycol methyl ether acetate, ethylene glycol methyl ether, ethylene glycol methyl ether acetate, ethyl lactate, γ-butyrolactone, ethyl 3-ethoxypropionate, N-methyl-2-pyrrolidinone, dimethylformamide, dimethylacetamide, diethylacetamide, dimethylsulfoxide, acetonitrile, carbitol acetate, dimethyl adipate, and sulfolane. These can be used individually or in a mixture of two or more thereof.

When the first composition includes less than about 15 percent by weight of the polar aprotic solvent, the photoresist and the etching residues may not be completely removed from the substrate, and also the detached photoresist may be readsorbed onto the substrate. In addition, when the content of the polar aprotic solvent is greater than about 60 percent by weight, photoresist removability of the first composition may not substantially increase in accordance with the content of the polar aprotic solvent. Therefore, the first composition for removing photoresist includes about 15 to about 60 percent by weight of the polar aprotic solvent based on a total weight of the first composition, and preferably, about 15 to about 50 percent by weight of the polar aprotic solvent.

The additive of first composition may promote decomposition of the photoresist and the etching residues, or prevent or reduce damage to the metal wiring. The additive may include, for example, an alkylammonium fluoride salt or a corrosion-inhibiting agent.

Examples of the alkylammonium fluoride salt that may be used as an additive in the first composition may include tetramethylammonium fluoride, tetraethylammonium fluoride, tetrapropylammonium fluoride, and tetrabutylammonium fluoride. These can be used individually or in a mixture of two or more thereof.

When the first composition includes less than about 0.1 percent by weight of the alkylammonium fluoride salt as the additive, an oxide polymer generated from the photoresist may not be easily decomposed, thus extending the photoresist removal time or resulting in incomplete removal of the photoresist. In addition, when the content of the alkylammonium fluoride salt is greater than about 1 percent by weight, the first composition may easily remove the oxide polymer and the photoresist, but the first composition may disadvantageously cause damage to an oxide layer and/or the metal wiring. For example, the metal wiring and/or an insulation layer may be damaged during the manufacturing processes utilized to fabricate a DRAM, an SRAM and/or a flash memory. Therefore, the first composition may preferably include about 0.1 to about 1 percent by weight of the alkylammonium fluoride salt as the additive based on a total weight of the first composition, and more preferably, about 0.3 to about 0.7 percent by weight of the alkylammonium fluoride salt.

Examples of the corrosion-inhibiting agent that may be used in the first composition may include catechol, ethanesulfonic acid or a mixture thereof.

The corrosion-inhibiting agent in the first composition may prevent or reduce damage to the metal wiring exposed to the first composition in addition to the alcoholamide compound. The first composition may preferably include about 1 to about 6 percent by weight of the corrosion-inhibiting agent as the additive based on a total weight of the first composition, and more preferably, about 2 to about 5 percent by weight of the corrosion-inhibiting agent.

The first composition for removing the photoresist further includes water. Examples of suitable water include pure water, ultra-pure water and deionized water. The water may serve as a solvent that dissolves the previously described components of the first composition. Viscosity and other characteristics of the first composition may be changed in accordance with the content of water.

The first composition for removing the photoresist having the above-described components may effectively remove a photoresist pattern used for an etching mask in manufacturing processes of, for example, a DRAM, an SRAM and a flash memory, and also may prevent metal wirings and fine patterns from being damaged. In addition, the first composition may efficiently remove etching residues such as an organic polymer, a metallic polymer and/or the oxide polymer that remain on a pattern formed using the photoresist pattern as an etching mask. Furthermore, fine etching residues generated in a plasma etching process may be effectively removed.

Second Example Composition for Removing a Photoresist

A second example composition for removing a photoresist will be fully described hereinafter. The second composition includes an alcoholamide compound represented by the above chemical formula (1), a polar aprotic solvent, an amine compound, an additive and water. The alcoholamide compound, the polar aprotic solvent, the additive and water are substantially the same as those of the first composition, so detailed descriptions thereof will be omitted here.

The second composition includes the amine compound in addition to the components of the first composition. The addition of the amine compound may be effective in enhancing removability of the photoresist and etching residues. Examples of the amine compound include hydroxylamine, an alkanolamine compound or a mixture thereof.

Examples of the alkanolamine compound may include monoethanolamine, diethanolamine, diisopropanolamine, n-butanolamine, etc. These can be used individually or in a mixture of two or more thereof.

When the second composition includes less than about 1 percent by weight of the amine compound, removabilities for the photoresist and the etching residues may not substantially increase. In addition, when the content of the amine compound is greater than about 30 percent by weight, the second composition may have sufficient removabilities for the photoresist and the etching residues, but the removabilities may not substantially increase in accordance with the content of the amine compound. Therefore, the second composition includes about 1 to about 30 percent by weight of the amine compound based on a total weight of the second composition, and preferably, about 5 to about 25 percent by weight of the amine compound based on a total weight of the second composition.

As a result, the second composition preferably includes about 5 to about 20 percent by weight of the alcoholamide compound represented by the above chemical formula (1), about 15 to about 60 percent by weight of the polar aprotic solvent, about 1 to about 30 percent by weight of the amine compound, about 0.1 to about 6 percent by weight of the additive, and the remainder of water. More preferably, the second composition may include about 7.5 to about 15 percent by weight of the alcoholamide compound, about 15 to about 50 percent by weight of the polar aprotic solvent, about 5 to about 25 percent by weight of the amine compound, about 0.3 to about 5 percent by weight of the additive, and the remainder of water.

When the second composition includes an alkylammonium fluoride salt as the additive, the second composition may preferably include about 0.1 to about 1 percent by weight of the alkylammonium fluoride salt, and more preferably, about 0.3 to about 0.7 percent by weight of the alkylammonium fluoride salt. In addition, when the second composition includes a corrosion-inhibiting agent as the additive, the second composition may preferably include about 1 to about 6 percent by weight of the corrosion-inhibiting agent, and more preferably, about 2 to about 5 percent by weight of the corrosion-inhibiting agent.

The second composition for removing the photoresist having the above-described components and the contents may effectively remove a photoresist pattern used for an etching mask in manufacturing processes of, for example, a DRAM, an SRAM and a flash memory, and also may prevent metal wirings and fine patterns from being damaged. Furthermore, fine etching residues generated in a plasma etching process may be effectively removed.

Method of Preparing the First Example Composition

A method of preparing the first example composition for removing a photoresist will be fully described hereinafter.

In the method of preparing the first composition, an alcoholamide compound represented by the above chemical formula (1) is prepared.

The alcoholamide compound may be prepared by reacting an amine compound with γ-butyrolactone. Examples of the amine compound include hydroxylamine, monoethanolamine, diethanolamine, diisopropanolamine, and n-butanolamine. These can be used individually or in a mixture of two or more thereof.

Types of the alcoholamide compound may be adjusted by changing types of the amine compound. Examples of the alcoholamide compound may include 4-hydroxy-N-(2-hydroxyethyl)butyramide (HHBA), 4-hydroxy-N,N-bis(2-hydroxyethyl)butyramide (HBHBA), 4-hydroxy-N,N-bis(2-hydroxypropyl)butyramide (HBPBA), and N,4-dihydroxy butyramide (DHBA).

For example, 4-hydroxy-N-(2-hydroxyethyl)butyramide (HHBA) may be synthesized by reacting monoethanolamine with γ-butyrolactone in a molar ratio of about 1:0.8 to about 1:1.2, more preferably, in a molar ratio of about 1:1.

4-hydroxy-N,N-bis(2-hydroxyethyl)butyramide (HBHBA) may be synthesized by reacting diethanolamine with γ-butyrolactone in a molar ratio of about 1:0.8 to about 1:1.2, more preferably, in a molar ratio of about 1:1.

4-hydroxy-N,N-bis(2-hydroxypropyl)butyramide (HBPBA) may be synthesized by reacting diisopropanolamine with γ-butyrolactone in a molar ratio of about 1:0.8 to about 1:1.2, more preferably, in a molar ratio of about 1:1.

N,4-dihydroxy butyramide (DHBA) may be synthesized by reacting hydroxylamine with γ-butyrolactone in a molar ratio of about 1:0.8 to about 1:1.2, more preferably, in a molar ratio of about 1:1.

The first composition is prepared by mixing about 5 to about 20 percent by weight of the alcoholamide compound, about 15 to about 60 percent by weight of a polar aprotic solvent, about 0.1 to about 6 percent by weight of an additive, and the remainder of water. The alcoholamide compound, the polar aprotic solvent and water are previously described, so detailed descriptions will be omitted here.

In an example embodiment, when an alkylammonium fluoride salt is used as the additive of the first composition, the first composition may be preferably prepared using about 0.1 to about 1 percent by weight of the alkylammonium fluoride salt, more preferably, about 0.3 to about 0.7 percent by weight of the alkylammonium fluoride salt.

Examples of the alkylammonium fluoride salt may include tetramethylammonium fluoride, tetraethylammonium fluoride, tetrapropylammonium fluoride, and tetrabutylammonium fluoride. These can be used individually or in a mixture of two or more thereof.

The alkylammonium fluoride salt may be synthesized by reacting hydrofluoric acid with an alkylammonium hydroxide in a molar ratio of about 1:0.8 to about 1:1.2, more preferably, in a molar ratio of about 1:1.

For example, tetramethylammonium fluoride may be synthesized by reacting hydrofluoric acid with tetramethylammonium hydroxide in a molar ratio of about 1:0.8 to about 1:1.2, more preferably, in a molar ratio of about 1:1.

Tetraethylammonium fluoride may be synthesized by reacting hydrofluoric acid with tetraethylammonium hydroxide in a molar ratio of about 1:0.8 to about 1:1.2, more preferably, in a molar ratio of about 1:1.

Tetrapropylammonium fluoride may be synthesized by reacting hydrofluoric acid with tetrapropylammonium hydroxide in a molar ratio of about 1:0.8 to about 1:1.2, more preferably, in a molar ratio of about 1:1.

Tetrabutylammonium fluoride may be synthesized by reacting hydrofluoric acid with tetrabutylammonium hydroxide in a molar ratio of about 1:0.8 to about 1:1.2, more preferably, in a molar ratio of about 1:1.

In another example embodiment, when a corrosion-inhibiting agent is used as the additive of the first composition, the first composition may be preferably prepared using about 1 to about 6 percent by weight of the corrosion-inhibiting agent, more preferably, about 2 to about 5 percent by weight of the corrosion-inhibiting agent. Examples of the corrosion-inhibiting agent may include catechol, ethanesulfonic acid and the like. These can be used individually or in a mixture of two or more thereof.

Method of Preparing the Second Example Composition

A method of preparing a second composition for removing a photoresist will be fully described hereinafter.

In the method of preparing the second composition, an alcoholamide compound represented by the above chemical formula (1) is prepared. The method of preparing the alcoholamide compound is previously described, so a detailed description in this regard will be omitted here.

The second composition is prepared by mixing about 5 to about 20 percent by weight of the alcoholamide compound, about 15 to about 60 percent by weight of a polar aprotic solvent, about 0.1 to about 6 percent by weight of an additive, about 1 to about 30 percent by weight of an amine compound including hydroxylamine, an alkanolamine or a mixture thereof, and a remainder of pure water. The alcoholamide compound, the polar aprotic solvent, the additive, the amine compound and water are previously described, so detailed descriptions thereof are omitted here.

Examples of the alkanolamine compound may include monoethanolamine, diethanolamine, diisopropanolamine, n-butanolamine. These can be used individually or in a mixture of two or more thereof.

Method of Removing a Photoresist

A method of removing a photoresist using the first or the second example composition will be fully described hereinafter.

The first composition for removing the photoresist is prepared in accordance with the previously described example embodiments. The prepared first composition includes about 5 to about 20 percent by weight of an alcoholamide compound represented by the above chemical formula (1), about 15 to about 60 percent by weight of a polar aprotic solvent, about 0.1 to about 6 percent by weight of an additive, and the remainder of water, based on a total weight of the first composition. Preferably, the first composition may include about 7.5 to about 15 percent by weight of the alcoholamide compound, about 15 to about 50 percent by weight of the polar aprotic solvent, about 0.3 to about 5 percent by weight of the additive, and the remainder of water.

The first composition is provided onto an object that is coated with photoresist to remove the photoresist from the object. The first composition may effectively remove the photoresist and fine etching residues generated in a plasma etching process.

The photoresist may be removed using a batch-type cleaning apparatus or a single-type cleaning apparatus. Particularly, when the photoresist is removed using the batch-type cleaning apparatus, the photoresist may be preferably immersed into the first composition for about 5 minutes to about 20 minutes. In addition, when the photoresist is removed using the single-type cleaning apparatus, the first composition may be preferably provided onto the photoresist for about 1 minute to about 10 minutes. A process time for providing the first composition onto the photoresist may be properly adjusted in accordance with an amount of photoresist residues, characteristics of an underlying layer or types of etching residues.

When the temperature of the first composition is lower than about 25° C., a process time needed for removing the photoresist may become excessively long, which is unpreferable. When the temperature of the first composition is higher than about 65° C., the photoresist may be rapidly removed, but a metal wiring and/or an oxide layer formed on the object (e.g., a processing wafer for manufacturing a DRAM, an SRAM or a flash memory) may be unpreferably damaged. Thus, the first composition may preferably have a temperature of about 25° C. to about 65° C., more preferably, about 30° C. to about 50° C.

Instead of the first composition, the second composition may be used for removing the photoresist. The second composition for removing photoresist includes the alcoholamide compound, the polar aprotic solvent, the additive, water and an amine compound having hydroxylamine, an alkanolamine or a mixture thereof. The method of removing the photoresist using the second composition is substantially the same as the method of removing the photoresist using the first composition.

The second composition includes about 5 to about 20 percent by weight of an alcoholamide compound, about 15 to about 60 percent by weight of a polar aprotic solvent, about 1 to about 30 percent by weight of an amine compound, about 0.1 to about 6 percent by weight of an additive, and the remainder of water, based on a total weight of the second composition. Preferably, the second composition may include about 7.5 to about 15 percent by weight of the alcoholamide compound, about 20 to about 50 percent by weight of the polar aprotic solvent, about 0.3 to about 5 percent by weight of the additive, about 5 to about 25 percent by weight of the amine compound, and the remainder of water.

Method of Manufacturing a Semiconductor Device

A method of manufacturing a semiconductor device using a composition for removing a photoresist will be fully described next with reference to accompanying drawings.

FIGS. 1 to 4 are cross-sectional views for use in explaining a method of manufacturing a semiconductor device in accordance with an example embodiment of the present invention.

FIG. 1 is a cross-sectional view illustrating a layer-to-be-patterned (hereinafter, referred to as a 'layer') 102 formed on a substrate 100.

The layer 102 will be patterned using a photoresist pattern 104 (see FIG. 2) as an etching mask. Examples of the layer 102 may include a metal layer, an oxide layer, a polysilicon layer, and/or a barrier layer. The layer 102 may have a single-layer structure or a multi-layer structure.

For example, the metal layer may be formed using tungsten, aluminum, titanium, and/or copper. The oxide layer may be formed using an oxide such as boro-phosphor silicate glass (BPSG), phosphor silicate glass (PSG), undoped silicate glass (USG), spin on glass (SOG), and/or plasma-enhanced tetraethyl orthosilicate (PE-TEOS).

The layer 102 may be formed during manufacture of a DRAM, an SRAM or a flash memory. For example, the layer 102 may have a multi-layer structure that includes a metal layer and an oxide layer formed on the metal layer. Additionally, the layer 102 may have a multi-layer structure successively including a first oxide layer, a metal layer and a second oxide layer.

Figure 2:
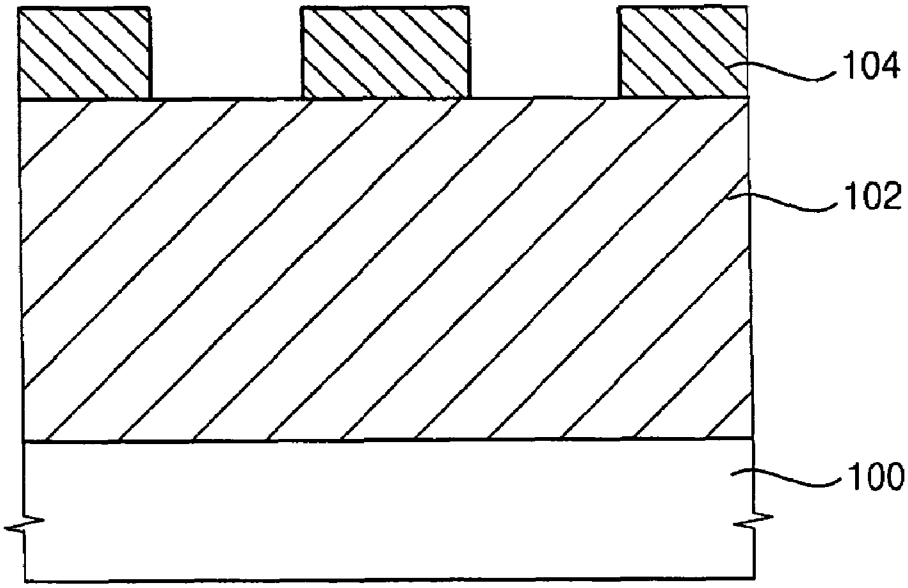

FIG. 2 is a cross-sectional view illustrating a step of forming the photoresist pattern 104 on the layer 102.

Referring to FIG. 2, the photoresist pattern 104 is formed on the layer 102 to expose a portion of the layer 102. In particular, a photoresist film is formed on the layer 102 by coating the layer 102 with a photoresist composition. The photoresist film is exposed to a light and developed using a developing solution to form the photoresist pattern 104 on the layer 102.

Figure 3:
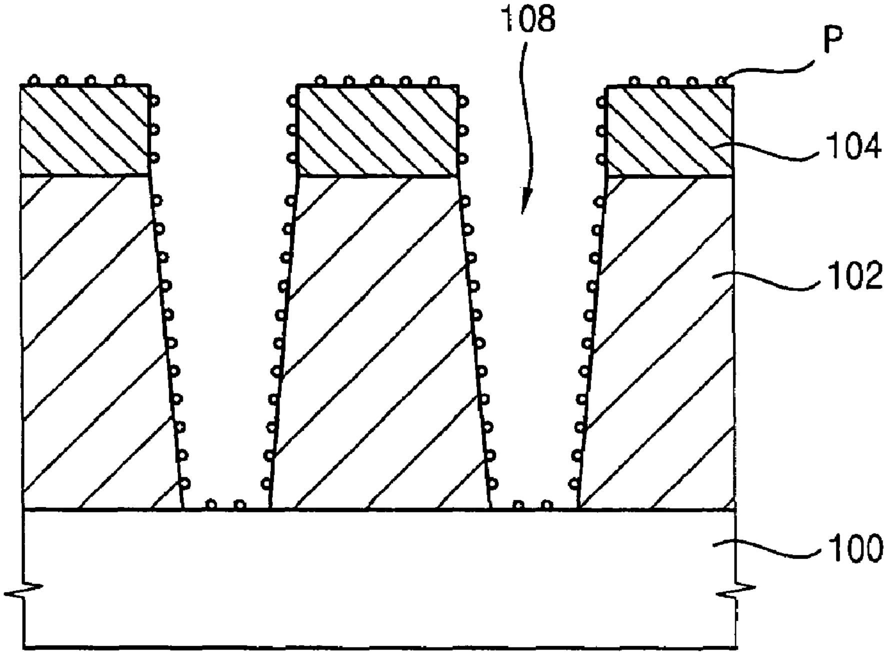

FIG. 3 is a cross-sectional view illustrating a step of forming a layer pattern 106 on the substrate 100.

Referring to FIG. 3, the layer 102 is partially etched using the photoresist pattern 104 as an etching mask to form the layer pattern 106 on the substrate 100 and an opening 108 exposing a portion of the substrate 100. The layer pattern 106 may be a metal wiring or an insulation layer pattern for manufacturing of a DRAM, an SRAM or a flash memory.

The layer 102 may be etched by a dry etching process that is performed using an etching gas, or a plasma etching process. After the etching process, etching residues (P) remain on the layer pattern 106 and in the opening 108. Examples of the etching residues (P) may include an organic polymer, an oxide polymer, and/or a metallic polymer.

When the layer 102 is etched by the plasma etching process, fine etching residues having nanometer dimensions may be generated.

Figure 4:
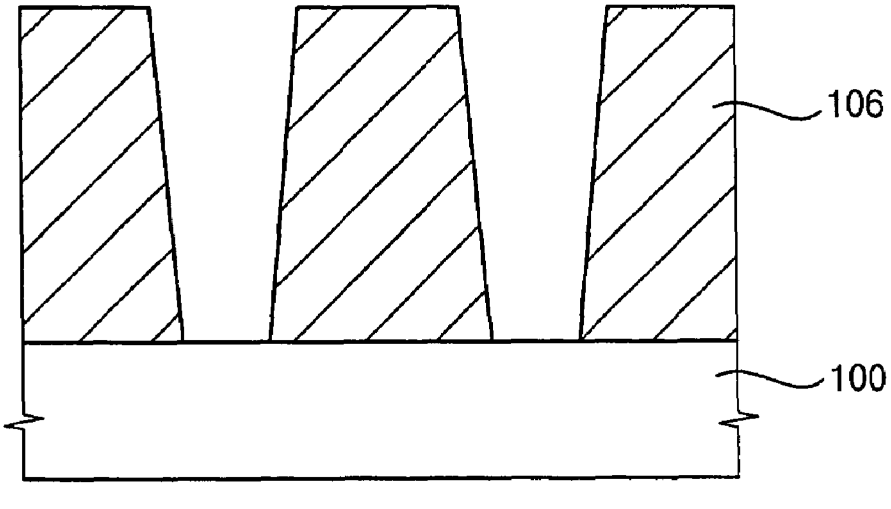
Figure 5:
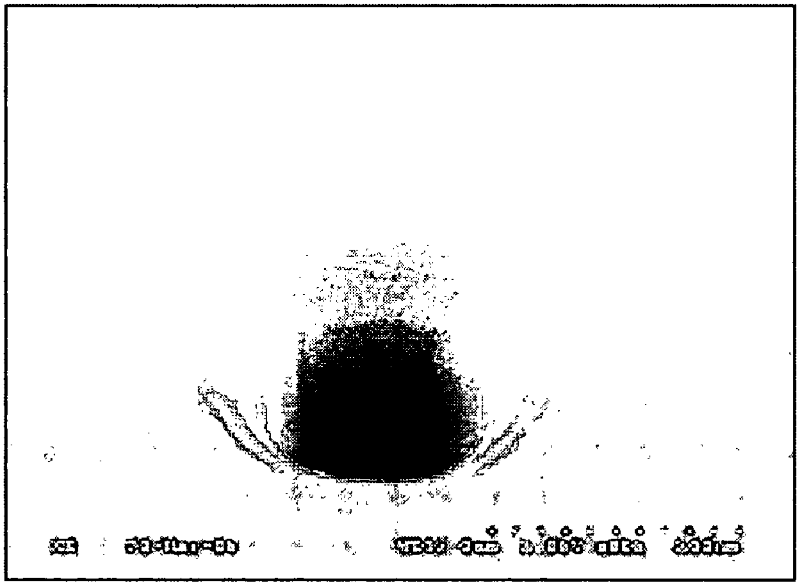
FIGS. 5 to 14 are scanning electron microscopic (SEM) pictures showing an upper surface of a multi-layer pattern from which a photoresist pattern is removed using compositions prepared in accordance with Examples 1 to 10, respectively.
Figure 6:
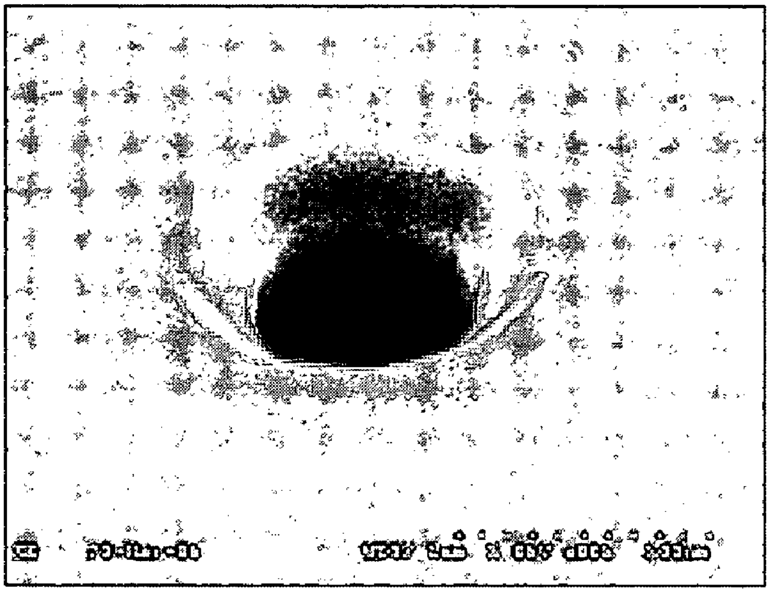
Figure 7:
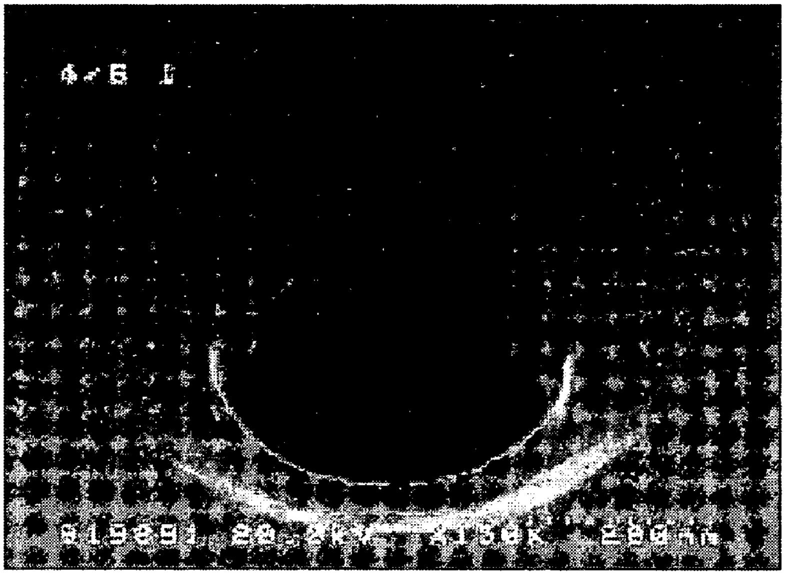
Figure 8:
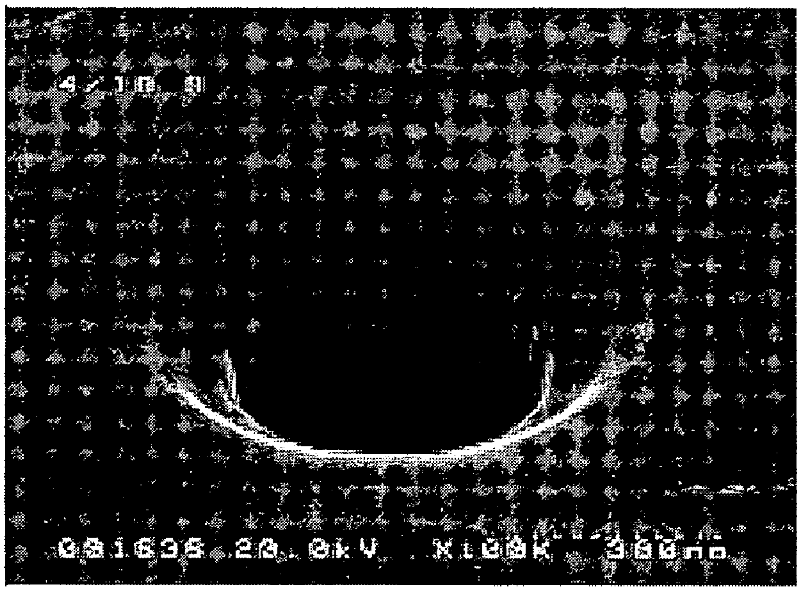
Figure 9:
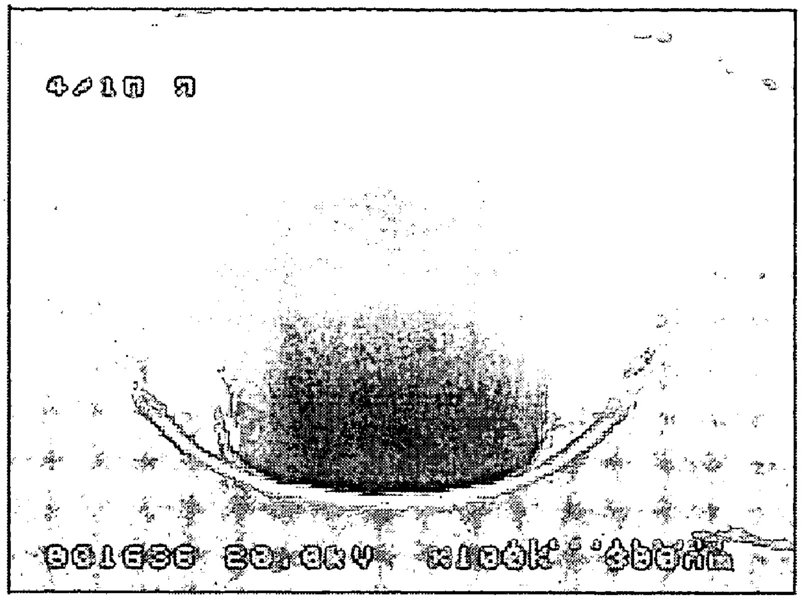
Figure 10:
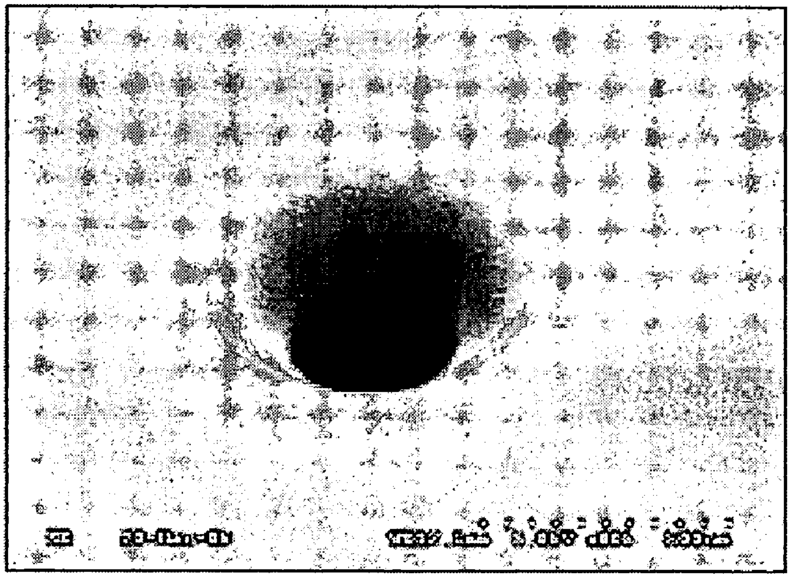
Figure 11:
Figure 12:
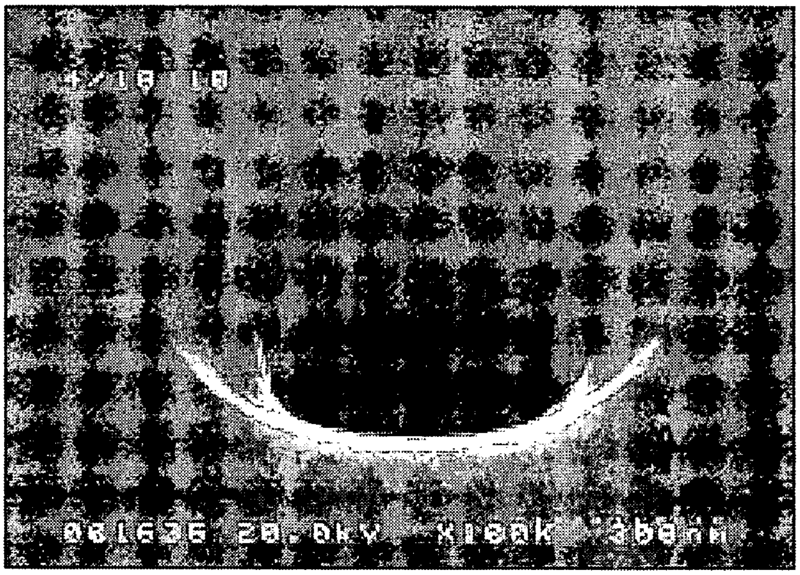
Figure 13:
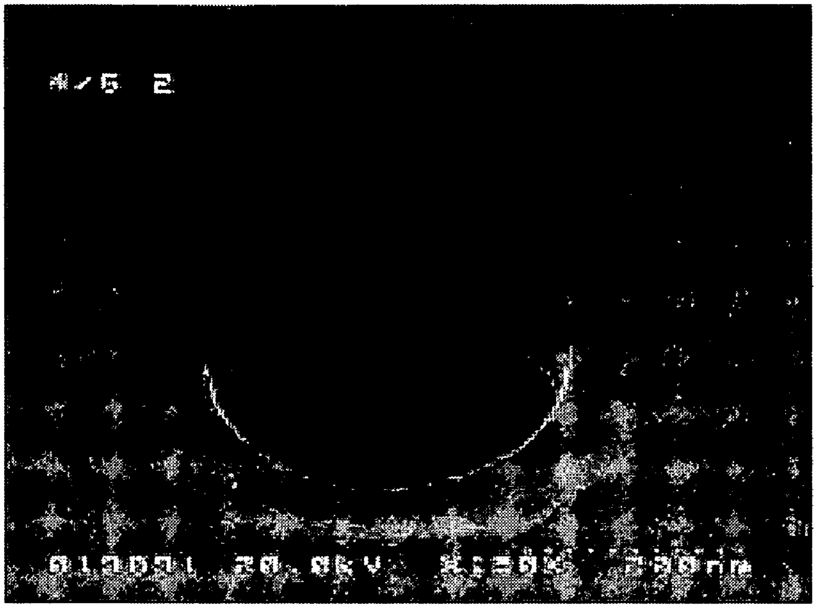
Figure 14:
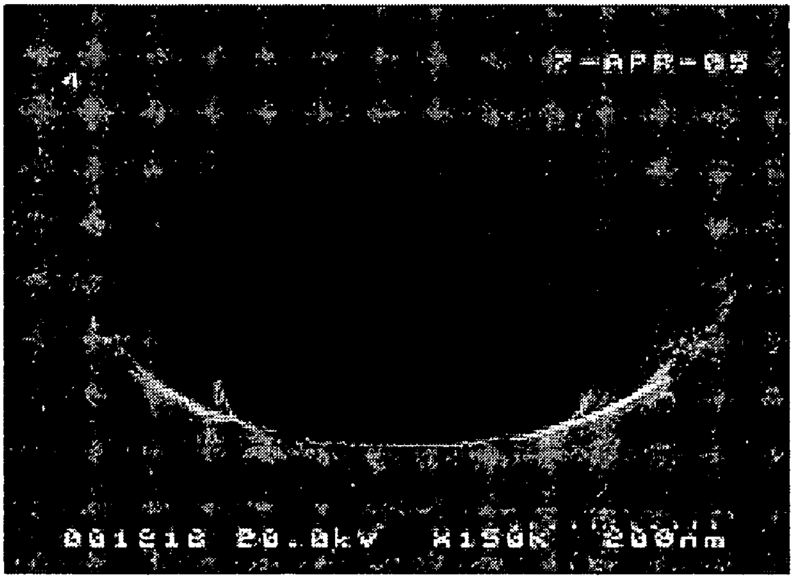

FIG. 4 is a cross-sectional view illustrating a step of removing the photoresist pattern 104 and the etching residues (P) from the substrate 100.

Referring to FIG. 4, the photoresist pattern 104 is removed from the substrate 100 using the first or the second composition for removing the photoresist. While the photoresist pattern 104 is removed, the etching residues (P) are removed as well.

The first composition includes about 5 to about 20 percent by weight of an alcoholamide compound represented by the above chemical formula (1), about 15 to about 60 percent by weight of a polar aprotic solvent, about 0.1 to about 6 percent by weight of an additive, and a remainder of water. Preferably, the first composition may include about 7.5 to about 15 percent by weight of the alcoholamide compound, about 15 to about 50 percent by weight of the polar aprotic solvent, about 0.3 to about 5 percent by weight of the additive, and a remainder of water.

The second composition for removing the photoresist includes about 5 to about 20 percent by weight of an alcoholamide compound, about 15 to about 60 percent by weight of a polar aprotic solvent, about 1 to about 30 percent by weight of an amine compound including hydroxylamine, an alkanolamine compound or a mixture thereof, about 0.1 to about 6 percent by weight of an additive, and a remainder of water. Preferably, the second composition may include about 7.5 to about 15 percent by weight of the alcoholamide compound, about 15 to about 50 percent by weight of the polar aprotic solvent, about 0.3 to about 5 percent by weight of the additive, about 5 to about 25 percent by weight of the amine compound, and a remainder of water.

When the first and the second compositions respectively include a corrosion-inhibiting agent as the additive, each of the first and the second compositions may preferably include about 1 to about 6 percent by weight of the corrosion-inhibiting agent, more preferably, about 2 to about 5 percent by weight of the corrosion-inhibiting agent. In addition, when the first and second compositions respectively include an alkylammonium fluoride salt as the additive, each of the first and the second composition may preferably include about 0.1 to about 1 percent by weight of the alkylammonium fluoride salt, more preferably, about 0.3 to about 0.7 percent by weight of the alkylammonium fluoride salt.

When the cleaning process is performed using the first or the second composition, the photoresist pattern 104 and the etching residues (P) may be effectively removed without damage to the layer pattern 106. That is, damage to the metal layer and/or the oxide layer in the layer pattern 106 may be reduced or prevented.

Additionally, after the cleaning process, the substrate 100 may be rinsed using deionized water to remove any remaining first or second composition from the substrate 100. The etching residues (P) and photoresist residuals may be largely removed from the substrate 100 in the rinsing process. Deionized water may be removed from the substrate 100 by a drying process.

A composition for removing a photoresist according to embodiments of the present invention will be further described hereinafter through Synthesis Examples of an alcoholamide compound, and Examples and Comparative Examples of the composition.

Synthesis of an Alcoholamide Compound

SYNTHESIS EXAMPLE 1

After about 25.3 mL of γ-butyrolactone was poured into a 100 mL flask, monoethanolamine was dropped into γ-butyrolactone and mixed with γ-butyrolactone at a temperature of about 25° C. for about one hour. Monoethanolamine was used in a molar ratio of about 1:1 between γ-butyrolactone and monoethanolamine. A reaction product between γ-butyrolactone and monoethanolamine was checked using thin layer chromatography (TLC). The reaction product was separated through an extraction process and a column chromatography process. The extraction process was performed using ethyl acetate as a solvent, and a separatory funnel was used as well. An extracted resultant was rinsed three times using sodium hydrogen carbonate ($NaHCO_3$) solution, and further rinsed three times using saturated sodium chloride (NaCl) solution. After the rinsing process, ethyl acetate was completely removed from the extracted resultant using a rotary evaporator. After evaporation of ethyl acetate, a remaining resultant was dissolved into an about 1:2 mixture of ethyl acetate and n-hexane. The reaction product was finally separated from a dissolved resultant through the column chromatography process. The column chromatography process was performed using silica gel. The reaction product was dried in a vacuum condition so that 4-hydroxy-N-(2-hydroxyethyl)butyramide (HHBA) represented by the above chemical formula (2) was finally obtained.

A yield of 4-hydroxy-N-(2-hydroxyethyl)butyramide (HHBA) was about 96 percent. The synthesis of 4-hydroxy-N-(2-hydroxyethyl)butyramide (HHBA) was confirmed using a proton nuclear magnetic resonance ($^1H$ NMR) spectrometer and a carbon nuclear magnetic resonance ($^{13}C$ NMR) spectrometer. Deuterochloroform ($CDCl_3$) was used as a solvent, and a 300 MHz nuclear magnetic resonance (NMR) spectrometer was used. In a $^1H$ NMR spectrum, chemical shifts were observed in δ 1.76-1.77 (m, 2H), 2.18-2.21 (m, 2H), 3.38-3.40 (m, 2H), 3.55-3.60 (m, 2H) and 3.75-3.81 (m, 2H). In a $^{13}C$ NMR spectrum, chemical shifts were observed in δ 28.8, 30.01, 46.0, 61.9, 64.4 and 174.4. The $^1H$ NMR and $^{13}C$ NMR spectrums showed the synthesis of 4-hydroxy-N-(2-hydroxyethyl)butyramide (HHBA).

SYNTHESIS EXAMPLE 2

An alcoholamide compound was synthesized by substantially the same manner as in Synthesis Example 1 except that diethanolamine was used instead of monoethanolamine. As a result, 4-hydroxy-N,N-bis(2-hydroxyethyl)butyramide (HBHBA) represented by the above chemical formula (3) was obtained.

A yield of 4-hydroxy-N,N-bis(2-hydroxyethyl)butyramide (HBHBA) was about 75 percent. The synthesis of 4-hydroxy-N,N-bis(2-hydroxyethyl)butyramide (HBHBA) was confirmed using the $^{1}$H NMR and the $^{13}$C NMR spectrometers in conditions substantially the same as those of Synthesis Example 1. In a $^{1}$H NMR spectrum, chemical shifts were observed in δ 1.76-1.77 (m, 2H), 2.18-2.21 (m, 2H), 3.38-3.40 (m, 4H), 3.58-3.60 (m, 2H) and 3.77-3.81 (m, 4H). In a $^{13}$C NMR spectrum, chemical shifts were observed in δ 28.1, 29.2, 50.7, 50.9, 61.9, 62.2, 62.3, 64.4 and 172.9. The $^{1}$H NMR and $^{13}$C NMR spectrums showed the synthesis of 4-hydroxy-N,N-bis(2-hydroxyethyl)butyramide (HBHBA).

SYNTHESIS EXAMPLE 3

An alcoholamide compound was synthesized by substantially the same manner as in Synthesis Example 1 except that diisopropanolamine was used instead of monoethanolamine. As a result, 4-hydroxy-N,N-bis(2-hydroxypropyl)butyramide (HBPBA) represented by the above chemical formula (4) was obtained.

A yield of 4-hydroxy-N,N-bis(2-hydroxypropyl)butyramide (HBPBA) was about 40 percent. The synthesis of 4-hydroxy-N,N-bis(2-hydroxypropyl)butyramide (HBPBA) was confirmed using the $^{1}$H NMR and the $^{13}$C NMR spectrometers in conditions substantially the same as those of Synthesis Example 1. In a $^{1}$H NMR spectrum, chemical shifts were observed in δ 1.22-1.23 (m, 4H), 1.77-1.79 (m, 2H), 2.15-2.17 (m, 2H), 3.35-3.36 (m, 4H), 3.52-3.53 (m, 2H) and 4.03-4.05 (m, 4H). In a $^{13}$C NMR spectrum, chemical shifts were observed in δ 20.3, 20.4, 28.1, 29.2, 57.9, 58.1, 62.0, 67.6, 67.7 and 173.0. The $^{1}$H NMR and $^{13}$C NMR spectrums showed the synthesis of 4-hydroxy-N,N-bis(2-hydroxypropyl)butyramide (HBPBA).

SYNTHESIS EXAMPLE 4

An alcoholamide compound was synthesized by substantially the same manner as in Synthesis Example 1 except that hydroxylamine was used instead of monoethanolamine. As a result, N,4-dihydroxy butyramide (DHBA) represented by the above chemical formula (5) was obtained.

A yield of N,4-dihydroxy butyramide (DHBA) was about 95 percent. The synthesis of N,4-dihydroxy butyramide (DHBA) was confirmed using the $^{1}$H NMR and the $^{13}$C NMR spectrometers in conditions substantially the same as those of Synthesis Example 1. In a $^{1}$H NMR spectrum, chemical shifts were observed in δ 1.73-1.77 (m, 2H), 2.14-2.17 (m, 2H) and 3.53 (t, 2H). In a $^{13}$C NMR spectrum, chemical shifts were observed in δ 26.3, 28.9, 62.0 and 169.8. The $^{1}$H NMR and $^{13}$C NMR spectrums showed the synthesis of N,4-dihydroxy butyramide (DHBA).

Preparation of Exemplary Compositions for Removing Photoresist

EXAMPLE 1

A composition for removing a photoresist was prepared by mixing about 15 percent by weight of 4-hydroxy-N-(2-hydroxyethyl)butyramide (HHBA) synthesized in Synthesis Example 1, about 50 percent by weight of dimethylacetamide (DMAc), about 0.3 percent by weight of tetramethylammonium fluoride (TMAF) and about 34.7 percent by weight of deionized water (DI), based on a total weight of the composition. The composition thus obtained had a pH of about 9.245.

EXAMPLE 2

A composition for removing a photoresist was prepared by mixing about 15 percent by weight of 4-hydroxy-N-(2-hydroxyethyl)butyramide (HHBA) synthesized in Synthesis Example 1, about 33 percent by weight of dimethylacetamide (DMAc), about 0.3 percent by weight of tetramethylammonium fluoride (TMAF) and about 51.7 percent by weight of deionized water (DI), based on a total weight of the composition. The composition thus obtained had a pH of about 9.521.

EXAMPLE 3

A composition for removing a photoresist was prepared by mixing about 15 percent by weight of 4-hydroxy-N-(2-hydroxyethyl)butyramide (HHBA) synthesized in Synthesis Example 1, about 50 percent by weight of dimethylformamide (DMF), about 5 percent by weight of catechol and about 30 percent by weight of deionized water (DI), based on a total weight of the composition. The composition thus obtained had a pH of about 9.123.

EXAMPLE 4

A composition for removing a photoresist was prepared by mixing about 15 percent by weight of 4-hydroxy-N-(2-hydroxyethyl)butyramide (HHBA) synthesized in Synthesis Example 1, about 50 percent by weight of dimethylformamide (DMF), about 5 percent by weight of ethanesulfonic acid (ESA) and about 30 percent by weight of deionized water (DI), based on a total weight of the composition. The composition thus obtained had a pH of about 8.452.

EXAMPLE 5

A composition for removing a photoresist was prepared by mixing about 15 percent by weight of 4-hydroxy-N,N-bis(2-hydroxyethyl)butyramide (HBHBA) synthesized in Synthesis Example 2, about 50 percent by weight of dimethylacetamide (DMAc), about 0.3 percent by weight of tetramethylammonium fluoride (TMAF) and about 34.7 percent by weight of deionized water (DI), based on a total weight of the composition. The composition thus obtained had a pH of about 9.365.

EXAMPLE 6

A composition for removing a photoresist was prepared by mixing about 15 percent by weight of 4-hydroxy-N,N-bis(2-hydroxypropyl)butyramide (HBPBA) synthesized in Synthesis Example 3, about 50 percent by weight of dimethylacetamide (DMAc), about 0.3 percent by weight of tetramethylammonium fluoride (TMAF) and about 34.7 percent by weight of deionized water (DI), based on a total weight of the composition. The composition thus obtained had a pH of about 9.457.

EXAMPLE 7

A composition for removing a photoresist was prepared by mixing about 15 percent by weight of N,4-dihydroxy butyramide (DHBA) synthesized in Synthesis Example 4, about 50 percent by weight of dimethylacetamide (DMAc), about 0.3 percent by weight of tetramethylammonium fluoride (TMAF) and about 34.7 percent by weight of deionized water (DI), based on a total weight of the composition. The composition thus obtained had a pH of about 9.214.

EXAMPLE 8

A composition for removing a photoresist was prepared by mixing about 15 percent by weight of 4-hydroxy-N-(2-hydroxyethyl)butyramide (HHBA) synthesized in Synthesis Example 1, about 50 percent by weight of dimethylsulfoxide (DMSO), about 0.3 percent by weight of tetramethylammonium fluoride (TMAF) and about 34.7 percent by weight of deionized water (DI), based on a total weight of the composition. The composition thus obtained had a pH of about 9.668.

EXAMPLE 9

A composition for removing a photoresist was prepared by mixing about 15 percent by weight of 4-hydroxy-N-(2-hydroxyethyl)butyramide (HHBA) synthesized in Synthesis Example 1, about 50 percent by weight of dimethylformamide (DMF), about 0.3 percent by weight of tetramethylammonium fluoride (TMAF) and about 34.7 percent by weight of deionized water (DI), based on a total weight of the composition. The composition thus obtained had a pH of about 9.658.

EXAMPLE 10

A composition for removing a photoresist was prepared by mixing about 15 percent by weight of 4-hydroxy-N-(2-hydroxyethyl)butyramide (HHBA) synthesized in Synthesis Example 1, about 50 percent by weight of dimethylacetamide (DMAc), about 0.3 percent by weight of tetramethylammonium fluoride (TMAF), about 10 percent by weight of monoethanolamine (MEA) and about 24.7 percent by weight of deionized water (DI), based on a total weight of the composition. The composition thus obtained had a pH of about 10.852.

COMPARATIVE EXAMPLE 1

A composition for removing a photoresist was prepared by mixing about 50 percent by weight of dimethylacetamide (DMAc), about 0.3 percent by weight of tetramethylammonium fluoride (TMAF) and about 49.7 percent by weight of deionized water (DI). The composition thus obtained had a pH of about 8.995.

COMPARATIVE EXAMPLE 2

A composition for removing a photoresist was prepared by mixing about 15 percent by weight of 4-hydroxy-N-(2-hydroxyethyl)butyramide (HHBA) synthesized in Synthesis Example 1, about 50 percent by weight of dimethylacetamide (DMAc) and about 35 percent by weight of deionized water (DI). The composition thus obtained had a pH of about 8.659.

Components and contents of the compositions prepared in Examples 1 to 10 and Comparative Examples 1 and 2 are shown in Table 1.

TABLE 1

| | Alcoholamide Compound [wt %] | | Polar Aprotic Solvent [wt %] | | Additive [wt %] | | Amine Compound [wt %] | | Deionized Water [wt %] |
|---|---|---|---|---|---|---|---|---|---|
| Example 1 | HHBA | 15 | DMAc | 50 | TMAF | 0.3 | — | | 34.7 |
| Example 2 | HHBA | 15 | DMAc | 33 | TMAF | 0.3 | — | | 51.7 |
| Example 3 | HHBA | 15 | DMF | 50 | Catechol | 5 | — | | 30 |
| Example 4 | HHBA | 15 | DMF | 50 | ESA | 5 | — | | 30 |
| Example 5 | HBHBA | 15 | DMAc | 50 | TMAF | 0.3 | — | | 34.7 |
| Example 6 | HBPBA | 15 | DMAc | 50 | TMAF | 0.3 | — | | 34.7 |
| Example 7 | DHBA | 15 | DMAc | 50 | TMAF | 0.3 | — | | 34.7 |
| Example 8 | HHBA | 15 | DMSO | 50 | TMAF | 0.3 | — | | 34.7 |
| Example 9 | HHBA | 15 | DMF | 50 | TMAF | 0.3 | — | | 34.7 |
| Example 10 | HHBA | 15 | DMAc | 50 | TMAF | 0.3 | MEA | 10 | 24.7 |
| Comparative Example 1 | — | | DMAc | 50 | TMAF | 0.3 | — | | 49.7 |
| Comparative Example 2 | HHBA | 15 | DMAc | 50 | — | | — | | 35 |

Evaluation of a Cleaning Ability of Compositions

Cleaning effectiveness for a photoresist pattern and etching residues was evaluated using the compositions for removing photoresist prepared in Examples 1 to 10 and Comparative Examples 1 and 2.

To evaluate the cleaning effectiveness of the compositions, a multi-layer structure that successively included a silicon oxide film, a first barrier film having a Ti/TiN structure, an aluminum film and a second barrier film, was formed on a silicon wafer having dimensions of about 2 cm×2 cm. Subsequently, a photoresist pattern was formed on the multi-layer structure, and then the multi-layer structure was partially removed using the photoresist pattern as an etching mask. The multi-layer structure was etched by a plasma etching process to form a multi-layer pattern having an opening that exposed a portion of the silicon wafer. An $O_2$ treatment process was performed on the photoresist pattern to finish a sample for evaluating the cleaning effectiveness. The photoresist pattern formed on the silicon wafer was denatured in the plasma etching process and the $O_2$ treatment process.

Each of the compositions prepared in Examples 1 to 10 and Comparative Examples 1 and 2 was poured into a 300 mL beaker. The silicon wafer including the photoresist pattern thereon was immersed in each of the compositions for about 20 minutes. The temperature of the compositions was maintained at about 65° C. Subsequently, the silicon wafer was immersed in deionized water for about 5 minutes so that each of the compositions was removed from the silicon wafer. The silicon wafer was dried by introduction of $N_2$ gas.

A scanning electron microscope (SEM) was used for observing photoresist residues and etching residues. An S-5000 device (trade name, manufactured by Hitachi, Ltd.; Japan) was used as the SEM. A small amount of photoresist residues and etching residues may mean that a composition has good removabilities of the photoresist pattern and the etching residues.

In an estimation of cleaning effectiveness of the composition, some factors may be considered. The composition for removing a photoresist may be required to permeate into the photoresist pattern to rapidly detach the photoresist pattern from the silicon wafer. The composition for removing the photoresist may be required to leave few residual impurities on the silicon wafer after the photoresist removal process that includes rinsing and drying the silicon wafer.

The cleaning effectiveness of the compositions prepared in Examples 1 to 10 and Comparative Examples 1 and 2 are shown in Table 2.

TABLE 2

| | Etching Residues |
|---|---|
| Example 1 | ○ |
| Example 2 | ○ |
| Example 3 | ○ |
| Example 4 | ○ |
| Example 5 | Δ |
| Example 6 | Δ |
| Example 7 | Δ |
| Example 8 | ○ |
| Example 9 | ○ |
| Example 10 | ○ |
| Comparative Example 1 | X |
| Comparative Example 2 | X |

In Table 2, ○ represents no etching residues, Δ represents a relatively small amount of the etching residues, and X represents a large amount of the etching residues.

As shown in Table 2, the compositions prepared in Examples 1 to 10 according to embodiments of the present invention effectively removed the photoresist pattern and the etching residues without causing severe damage to the silicon oxide film and the aluminum film, compared with the compositions prepared in Comparative Examples 1 and 2.

Figure 15:
FIGS. 15 and 16 are SEM pictures showing an upper surface of a multi-layer pattern from which a photoresist pattern is removed using compositions prepared in accordance with Comparative Examples 1 and 2, respectively.
Figure 16:
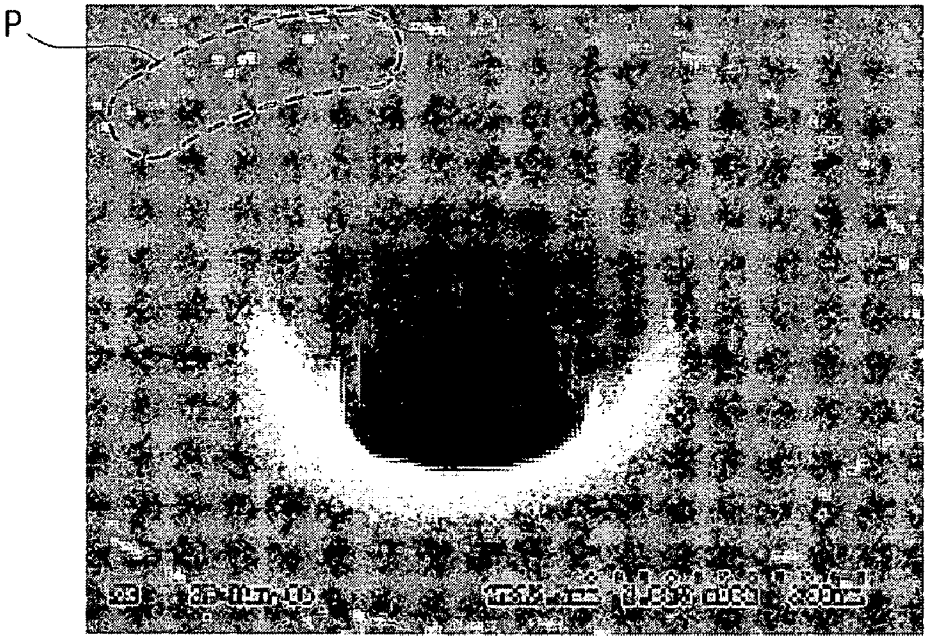
Figure 17:
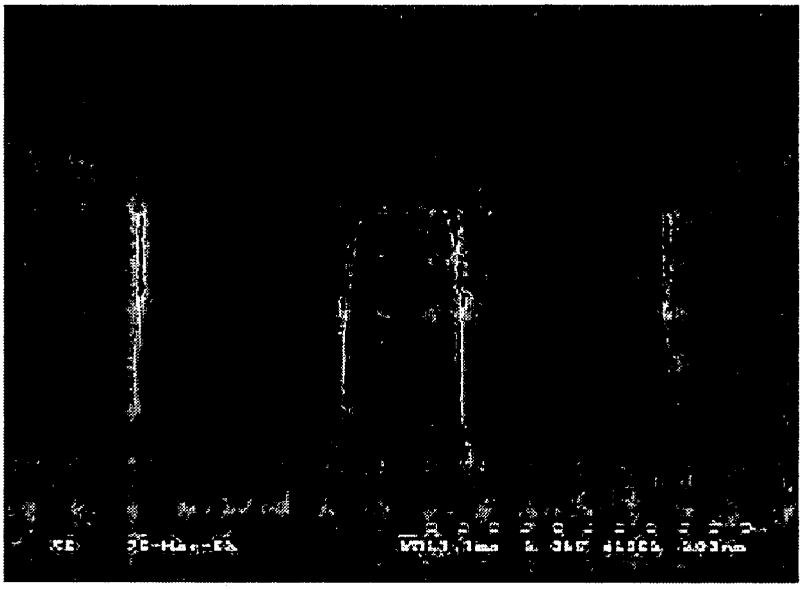
FIGS. 17 to 26 are SEM pictures showing a cross-section of a multi-layer pattern from which a photoresist pattern is removed using the compositions prepared in accordance with Examples 1 to 10, respectively.
Figure 18:
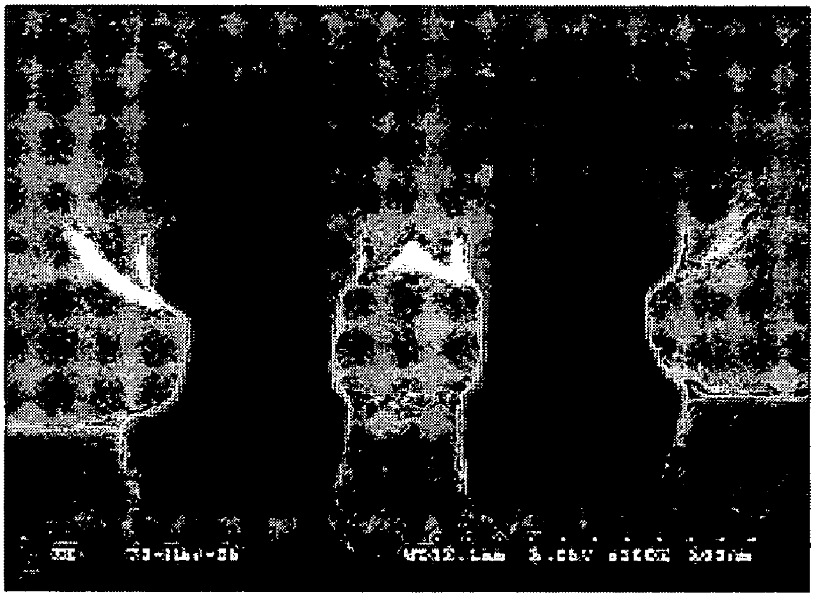
Figure 19:
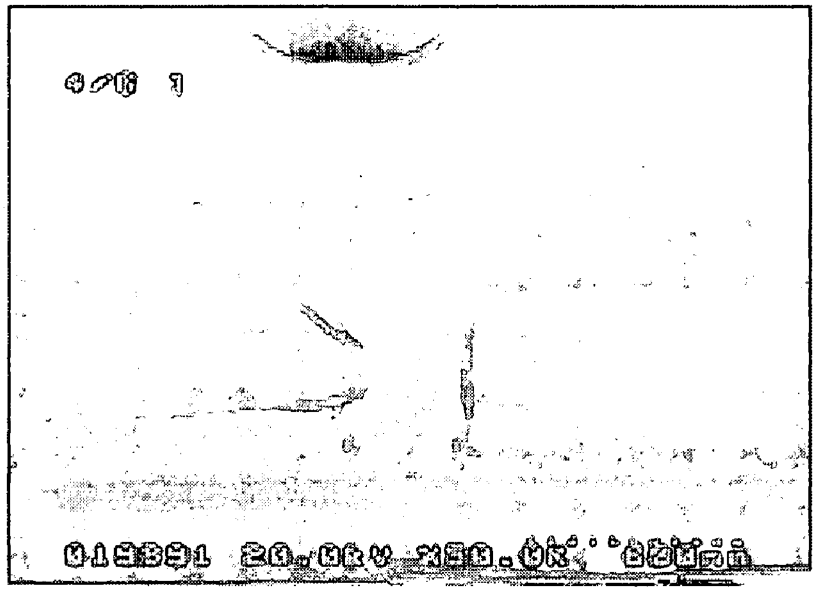
Figure 20:
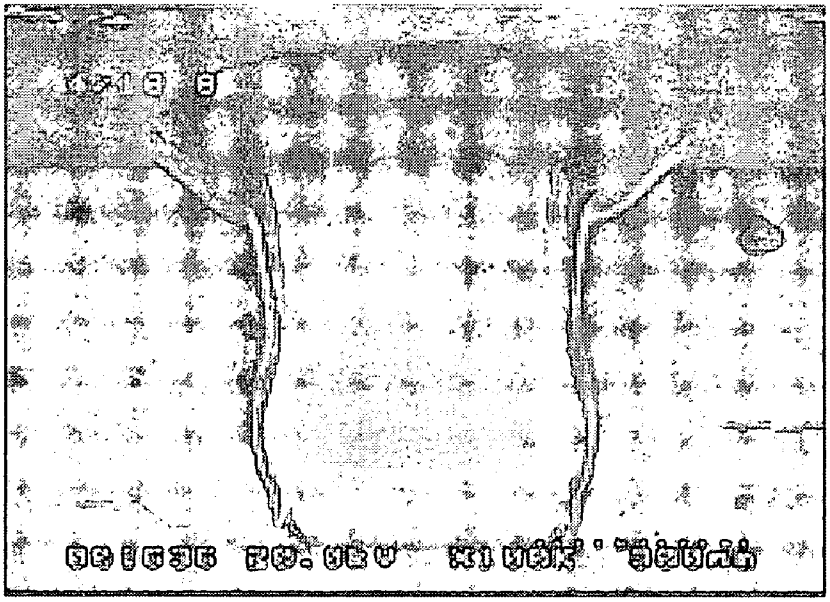
Figure 21:
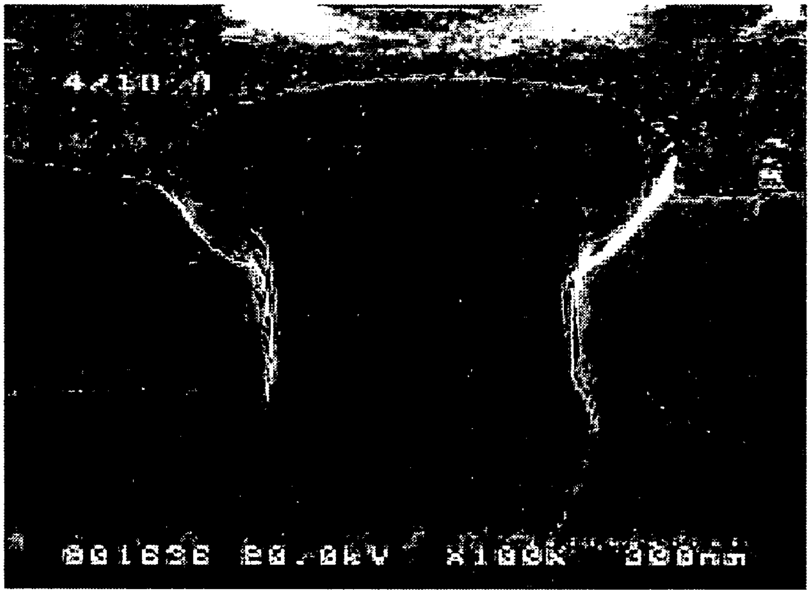
Figure 22:
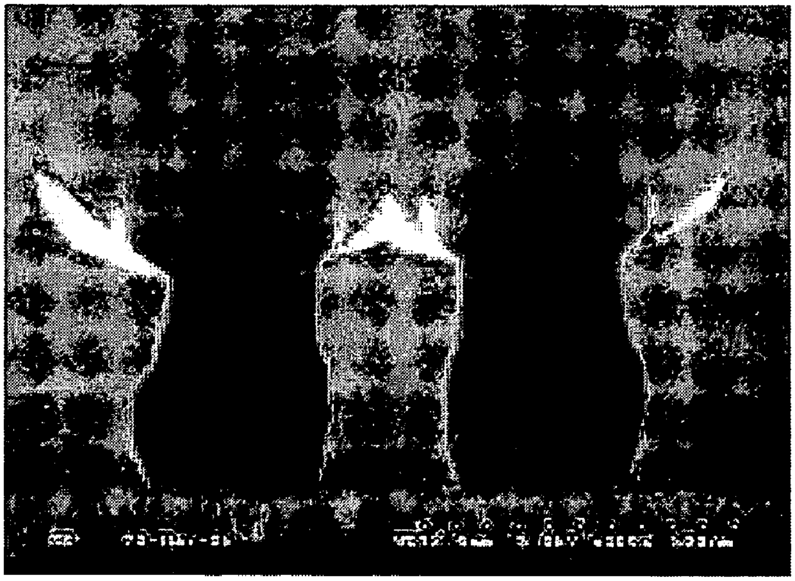
Figure 23:
Figure 24:
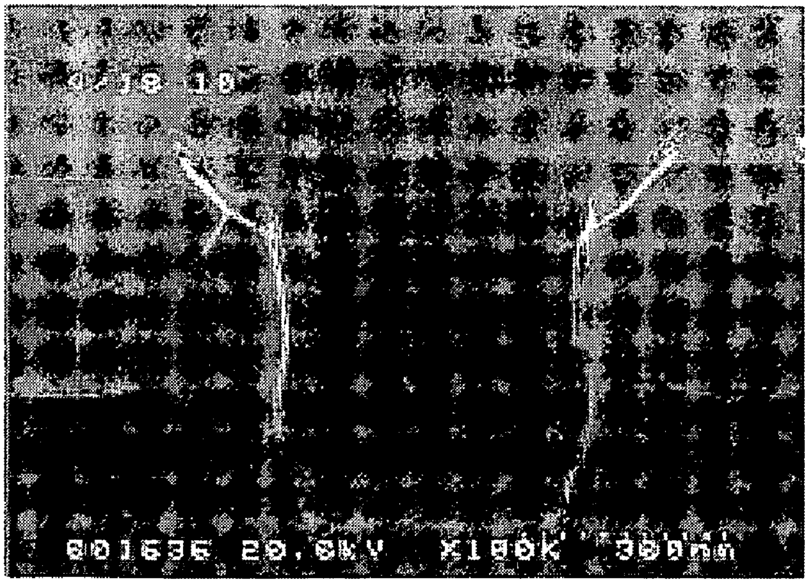
Figure 25:
Figure 26:
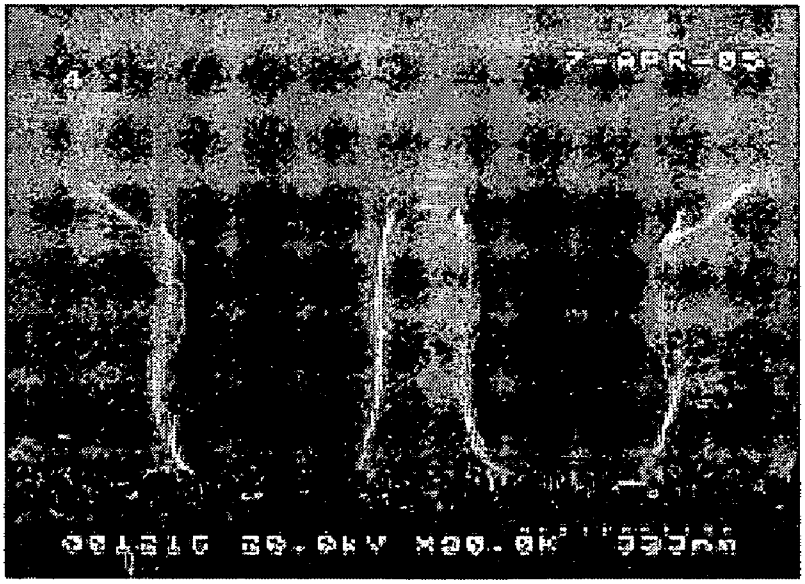

FIGS. 5 to 14 are SEM pictures showing an upper surface of the multi-layer pattern from which the photoresist pattern is removed using each of the compositions prepared in Examples 1 to 10. FIGS. 15 and 16 are SEM pictures showing an upper surface of the multi-layer pattern from which the photoresist pattern is removed using each of the compositions prepared in Comparative Examples 1 and 2.

Referring to Table 1 and FIGS. 5 to 16, when the photoresist pattern was removed using the compositions prepared in Comparative Examples 1 and 2, photoresist residues and etching residues were spread around the opening of the multi-layer pattern. However, when the photoresist pattern was removed using the compositions prepared in Examples 1 and 10, photoresist residues and etching residues were not observed, or a relatively small amount of residues was observed. Therefore, the composition for removing photoresist according to embodiments of the present invention exhibited favorable cleaning effectiveness.

Evaluation of Damage to an Oxide Film and an Aluminum Film

Damage to an oxide film and an aluminum film were evaluated using the compositions prepared in Examples 1 to 10 and Comparative Examples 1 and 2.

To evaluate whether or not the compositions excessively etch the oxide film and the aluminum film, samples were prepared by processes substantially the same as processes for evaluation of cleaning effectiveness. Each of the compositions prepared in Examples 1 to 10 and Comparative Examples 1 and 2 was poured into a 300 mL beaker. A silicon wafer including a multi-layer pattern and a photoresist pattern thereon was immersed in each of the compositions for about 20 minutes. The temperature of the compositions was maintained at about 65° C. Subsequently, the silicon wafer was immersed in deionized water for about 5 minutes so that each of the compositions was removed from the silicon wafer. The silicon wafer was completely dried by introduction of $N_2$ gas. The silicon wafer was cut for observing a cross-section of the multi-layer pattern. A scanning electron microscope (SEM) was used for observing damage to the oxide film such as a silicon oxide film and the aluminum film in the multi-layer pattern. An S-5000 device (trade name, manufactured by Hitachi, Ltd.; Japan) was used as the SEM.

Whether or not the compositions prepared in Examples 1 to 10 and Comparative Examples 1 and 2 excessively etched the oxide film and the aluminum film is shown in Table 3.

TABLE 3

| | Damage to Oxide Film | Damage to Aluminum Film |
|---|---|---|
| Example 1 | ○ | ○ |
| Example 2 | Δ | ○ |
| Example 3 | ○ | ○ |
| Example 4 | ○ | ○ |
| Example 5 | Δ | ○ |
| Example 6 | Δ | ○ |
| Example 7 | Δ | ○ |
| Example 8 | ○ | ○ |
| Example 9 | ○ | ○ |
| Example 10 | ○ | ○ |
| Comparative Example 1 | X | Δ |
| Comparative Example 2 | X | ○ |

In Table 3, ○ represents no damage to a film, Δ represents a slight damage to the film, and X represents a severe damage to the film.

As shown in Table 3, the compositions prepared in Examples 1 to 10 according to embodiments of the present invention did not excessively etch the oxide film and the aluminum film, compared with those prepared in Comparative Examples 1 and 2.

Figure 27:
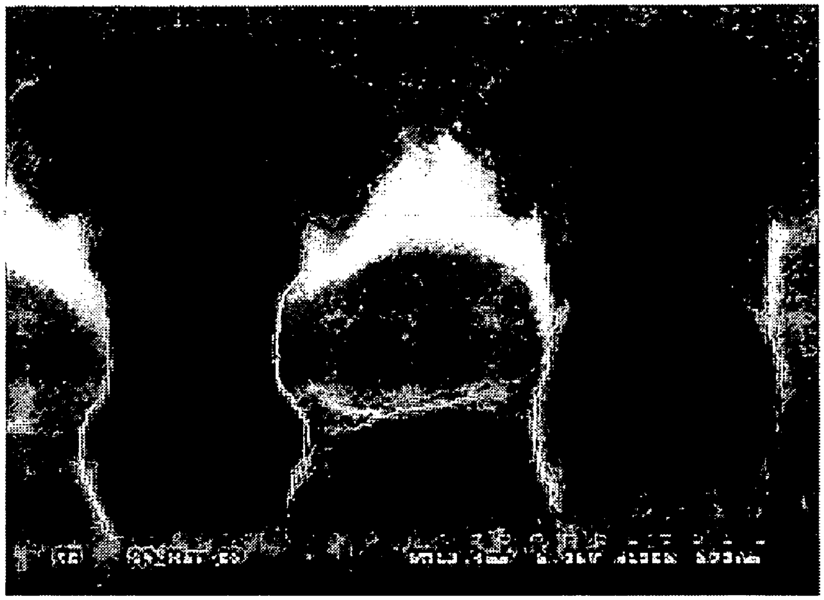
FIGS. 27 and 28 are SEM pictures showing a cross-section of a multi-layer pattern from which a photoresist pattern is removed using the compositions prepared in accordance with Comparative Examples 1 and 2, respectively.
Figure 28:

FIGS. 17 to 26 are SEM pictures showing a cross-section of the multi-layer pattern from which the photoresist pattern is removed using each of the compositions prepared in Examples 1 to 10. FIGS. 27 and 28 are SEM pictures showing a cross-section of the multi-layer pattern from which the photoresist pattern is removed using each of the compositions prepared in Comparative Examples 1 and 2.

Referring to Table 3 and FIGS. 17 to 28, when the photoresist pattern was removed using the compositions prepared in Comparative Examples 1 and 2, the oxide film and the aluminum film of the multi-layer pattern were excessively etched. However, when the photoresist pattern was removed using the compositions prepared in Examples 1 and 10, the oxide film and the aluminum film of the multi-layer pattern were slightly etched or not etched. When the photoresist pattern was removed using the compositions prepared in Examples 2 and 7, the oxide film was partially etched, but an overall shape of the multi-layer pattern was maintained.

According to the present invention, the composition for removing the photoresist may effectively remove photoresist and fine etching residues without excessive etching of metal. Thus, the composition for removing the photoresist may effectively remove a photoresist pattern and fine etching residues, and also prevent or reduce damage to a metal pattern and/or an oxide layer. Therefore, the composition for removing the photoresist may reduce the generation of defects during fabrication of semiconductor devices such as DRAM, SRAM and flash memory devices, thus improving the productivity of semiconductor manufacturing processes.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a semiconductor device, comprising:

forming a layer on a substrate;

forming a photoresist pattern on the layer, the photoresist pattern exposing a portion of the layer; and removing the photoresist pattern from the substrate by applying a composition which includes about 5 to about 20 percent by weight of an alcoholamide compound, about 15 to about 60 percent by weight of a polar aprotic solvent, about 0.1 to about 6 percent by weight of an additive, and water, wherein the alcoholamide compound is chemically structured as follows:

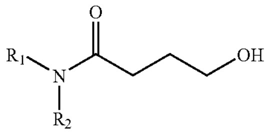

where $R_1$ is a hydroxyl group or a hydroxyalkyl group, and $R_2$ is a hydrogen atom or a hydroxyalkyl group.

2. The method of claim 1, wherein the composition comprises about 0.1 to about 1 percent by weight of an alkylammonium fluoride salt as the additive based on a total weight of the composition.

3. The method of claim 1, wherein the composition comprises about 1 to about 6 percent by weight of a corrosion-inhibiting agent as the additive based on a total weight of the composition.

4. The method of claim 1, wherein the composition further comprises about 1 to about 30 percent by weight of hydroxylamine, an alkanolamine compound or a mixture thereof.

5. The method of claim 1, wherein the layer comprises a metal film, an insulation film or a combination thereof.

6. The method of claim 1, further comprising etching the layer using the photoresist pattern as an etching mask.

7. The method of claim 6, wherein the layer is etched using plasma.

8. The method of claim 1, further comprising removing etching residues generated in an etching process from the substrate, while simultaneously removing the photoresist pattern from the substrate.

9. The method of claim 8, wherein the etching residues comprise an organic polymer, an oxide polymer, a metallic polymer or a combination thereof.

10. The method of claim 1, further comprising rinsing the substrate, and drying the substrate.

11. The method of claim 1, wherein the alcoholamide compound comprises at least one selected from the group consisting of 4-hydroxy-N-(2-hydroxyethyl)butyramide, 4-hydroxy-N,N-bis(2-hydroxyethyl) butyramide, 4-hydroxy-N,N-bis(2-hydroxypropyl)butyramide and N,4-dihydroxy butyramide.

12. The method of claim 11, wherein the alcoholamide compound comprises 4-hydroxy-N-(2-hydroxyethyl)butyramide.

13. The method of claim 1, wherein the polar aprotic solvent comprises at least one selected from the group consisting of propylene glycol methyl ether, propylene glycol methyl ether acetate, ethylene glycol methyl ether, ethylene glycol methyl ether acetate, ethyl lactate, γ-butyrolactone, ethyl 3-ethoxypropionate, N-methyl-2-pyrrolidinone, dimethylformamide, dimethylacetamide, diethylacetamide, dimethylsulfoxide, acetonitrile, carbitol acetate, dimethyl adipate and sulfolane.

14. The method of claim 2, wherein the alkylammonium fluoride salt comprises at least one selected from the group consisting of tetramethylanimonium fluoride, tetraethylanimonium fluoride, tetrapropylammonium fluoride and tetrabutylammonium fluoride.

15. The method of claim 3, wherein the corrosion-inhibiting agent comprises catechol, ethanesulfonic acid or a mixture thereof.

16. The method of claim 1, wherein at least one of $R_1$ and $R_2$ is a hydroxyalkyl group, and wherein the hydroxyalkyl group of the at least one of $R_1$ and $R_2$ independently comprises any one selected from the group consisting of hydroxymethyl group, hydroxyethyl group, hydroxypropyl group, hydroxyisopropyl group and hydroxybutyl group.

17. The method of claim 4, wherein the composition comprises the alkanolamine compound, and wherein the alkanolamine compound comprises at least one selected from the group consisting of monoethanolamine, diethanolamine, diisopropanolamine and n-butanolamine.

18. A method of manufacturing a semiconductor device, comprising:

forming a layer on a substrate;

forming a photoresist pattern on the layer, the photoresist pattern exposing a portion of the layer;

etching the layer using the photoresist pattern as an etching mask to form a layer pattern on the substrate; and removing the photoresist pattern and etching residues from the substrate and the layer pattern by applying a composition which includes about 5 to about 20 percent by weight of an alcoholamide compound, about 15 to about 60 percent by weight of a polar aprotic solvent, about 0.1 to about 6 percent by weight of an additive, and water, wherein the alcoholamide compound is chemically structured as follows:

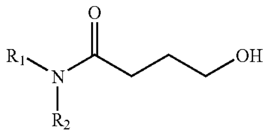

where $R_1$ is a hydroxyl group or a hydroxyalkyl group, and $R_2$ is a hydrogen atom or a hydroxyalkyl group.

* * * * *